(12) United States Patent
Clark et al.

(10) Patent No.: US 6,495,380 B2
(45) Date of Patent: Dec. 17, 2002

(54) EPITAXIALLY GROWN AVALANCHE PHOTODIODE

(75) Inventors: William R. Clark, Tyngsboro, MA (US); Serguei An, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 31 days.

(21) Appl. No.: 09/733,060

(22) Filed: Dec. 11, 2000

(65) Prior Publication Data

US 2002/0070384 A1 Jun. 13, 2002

(51) Int. Cl.$^7$ ............................................. H01L 21/00
(52) U.S. Cl. ............................ 438/22; 438/39; 438/41; 438/46; 438/47; 438/141; 438/285; 257/431; 257/458; 257/459; 257/461; 257/466
(58) Field of Search ........................... 438/141, 285, 438/590, 22, 46, 47, 39, 41; 257/186, 431, 458, 459, 461, 466

(56) References Cited

U.S. PATENT DOCUMENTS 4,794,439 A * 12/1988 Webb et al. ................... 357/30

5,552,629 A * 9/1996 Watanabe ..................... 257/438

OTHER PUBLICATIONS

S. M. Sze, Physics of Semiconductor Device, $2^{nd}$ Ed, 1981, p. 774–776.*

* cited by examiner

*Primary Examiner*—Phat X. Cao
*Assistant Examiner*—Wai-Sing Louie

(57) ABSTRACT

A photodiode, and method of manufacturing thereof, is provided which combines advantages of planar structure photodiodes and mesa structure photodiodes. Semiconductor layers are epitaxially grown as is done for traditional planar structures. However the upper doped layer is also epitaxially grown, unlike traditional planar structures in which the upper layer is formed by diffusion depth targeting into one of the intrinsically doped layers. The edges of the upper layer are then removed by etching to leave an island-like structure. Termination junctions are formed by deep diffusion of an impurity of the same type as the dopant in the lower doped layer, thereby avoiding exposure of the edges of the photodiode to the ambient environment. The photodiode therefore combines the reliability of a planar structure device with the precision of a mesa structure device. The invention is particularly suited to avalanche photodiodes, in which suppression of edge breakdown is most beneficial.

18 Claims, 3 Drawing Sheets

EPITAXIALLY GROWN AVALANCHE PHOTODIODE

FIELD OF THE INVENTION

This invention relates to P-I-N photodiodes, particularly avalanche photodiodes, and to a method of manufacturing such photodiodes.

BACKGROUND OF THE INVENTION

The generic structure of an Avalanche Photodiode (APD) consists of two electrical contacts separated by a P-I-N diode. The two electrical contacts are separated by at least three layers of semiconductor material. One electrical contact is in contact with a P-doped semiconductor layer (P-layer). The second electrical contact is in contact with an N-doped semiconductor layer (N-layer). The P-doped semiconductor layer is separated from the N-doped semiconductor layer by at least one intrinsic semiconductor layer (I-layer). More than one I-layer may be used to enhance performance of the APD. The dimensions, doping levels, and material of each layer depend on the application for which the APD will be used. The APD is bounded on its edges by termination junctions lying perpendicular to the planes of the junctions between the layers.

One current APD structure widely available commercially is a planar structure. A lower I-layer is epitaxially grown on the N-layer. An upper I-layer is epitaxially grown on the lower I-layer. Rather than growing a P-layer, a P-region is introduced into a portion of the upper I-layer by diffusion of P-type impurities through a window in a dielectric mask. The APD is bounded on its edge by imaginary termination junctions. These termination junctions are imaginary in that they are not defined physically, but occur because the upper I-layer electrically isolates different P-regions diffused into the same material. Because the termination junctions are never exposed to any processing or ambient environment, the termination junctions are strong and planar structures are of superior reliability. However, the depth of the P-region is difficult to control precisely due to the nature of the diffusion process. As a result, the high performance required of APDs is difficult to achieve. In addition, because the diffusion process allows P-type impurities to end up under the edges of the mask and the P-region is therefore extended horizontally in undesired locations, parasitic capacitance effects arise.

A second current APD structure used in research and available commercially in small quantities is a mesa structure. As with the planar structure, an I-layer is epitaxially grown on a N-layer. However, the P-layer is then epitaxially grown on the I-layer. The termination junctions are formed by dry etching all layers at the desired width of the APD. Formation of the P-layer through epitaxial growth results in a well defined P-layer thickness and doping profile, and the horizontal dimension of the P-layer is well defined because of the dry etching process, and parasitic effects are much less than in a planar structure. The well defined thickness and horizontal dimension of the P-layer allow high performance APDs to be built. Edge breakdown can be reduced by bevelling the edges of the layers. However, edge breakdown is still a factor as the termination junction is exposed to ambient air during the fabrication process, and the reliability of the APD is reduced.

SUMMARY OF THE INVENTION

The present invention provides a method of fabricating a semiconductor photodiode comprising epitaxially grown layers of semiconductor material. A first doped layer is formed on a semi-insulating substrate, and has a p-type conductivity. An intrinsic layer is formed lying adjacent to the first doped layer. Other intrinsic layers may be formed over the first intrinsic layer. A second doped layer having an n-type conductivity is formed adjacent to the uppermost intrinsic layer. The second doped layer is etched to leave an island-like structure. The edge regions of the intrinsic layers and the first doped layer are doped using deep diffusion to produce doped regions having a p-type conductivity. The result of the deep diffusion process is that the horizontal dimension in each layer of the portion which does not contain the doped region decreases with vertical proximity to the second doped layer. The deep diffusion may be achieved by placing a dielectric over the second doped layer and extending partially over the uppermost intrinsic layer, and diffusing impurities through the uncovered portions of the uppermost intrinsic layer as far as and into the first doped layer. Alternately, the first doped layer has an n-type conductivity, the second doped layer has a p-type conductivity, the doped regions have an n-type conductivity, and the doped regions are formed by ion implantation through the vertical surfaces of a mesa structure. The invention is particularly suited to avalanche photodiodes, in which suppression of edge breakdown is most beneficial.

High performance photodiodes can be produced using this method because the formation of the various layers through epitaxial growth results in well managed doping profiles and layer thicknesses. Furthermore, because the junctions between the N-layer and the intrinsic layer are not diffused junctions there is less parasitic capacitance than in planar devices. The photodiodes are highly reliable as the termination junctions are formed by the doping regions, and are never exposed to the ambient environment. No guardrings and no special layers are needed to suppress edge breakdown.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The invention will now be described in greater detail with reference to the accompanying diagrams, in which.

DETAILED DESCRIPTION OF THE PREFERRED EMBODIMENTS

Figure 1:
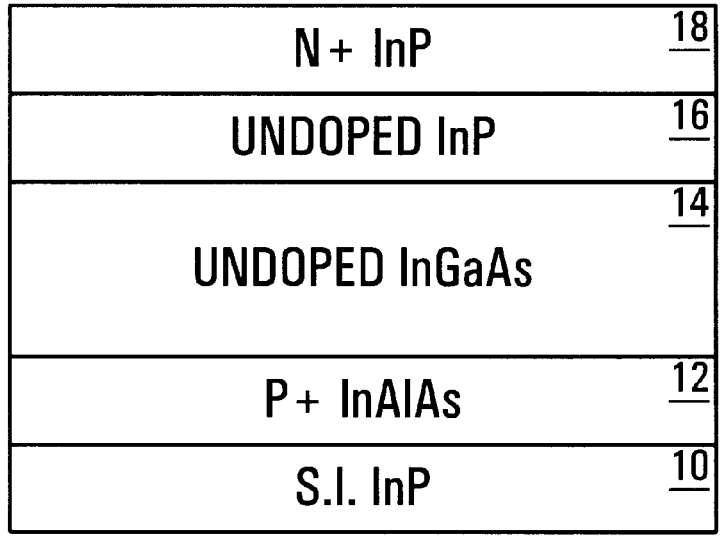
FIG. 1 is a diagram of an initial set of semiconductor layers from which the P-I-N photodiode of the invention is formed.

Referring to FIG. 1, a series of semiconductor layers is shown. The semiconductor layers form the initial structure from which a P-I-N photodiode in accordance with the invention is formed, and are epitaxially grown according to techniques well known to those skilled in the art of semiconductor manufacturing. An InP layer 10 (the SI-layer) is a semi-insulating substrate upon which the other layers are grown. A layer 12 of InAlAs doped with P-type impurities (the P-layer) is grown on the SI-layer 10, and is approximately 2 micrometers thick. A layer 14 of undoped InGaAs (the lower I-layer) is grown on the P-layer 12, and is from one to three micrometers thick. A layer 16 of undoped InP (the upper I-layer) is grown on the lower I-layer 14, and is from 0.1 to 0.5 micrometers thick. Finally, a layer 18 of InP doped with N-type impurities (the N-layer) is grown on the upper I-layer, and is approximately 0.2 micrometers thick. Because the N-layer is epitaxially grown rather than formed by ion implantation into the upper I-layer, the thickness and doping profile of the N-layer are controlled accurately.

Figure 2:
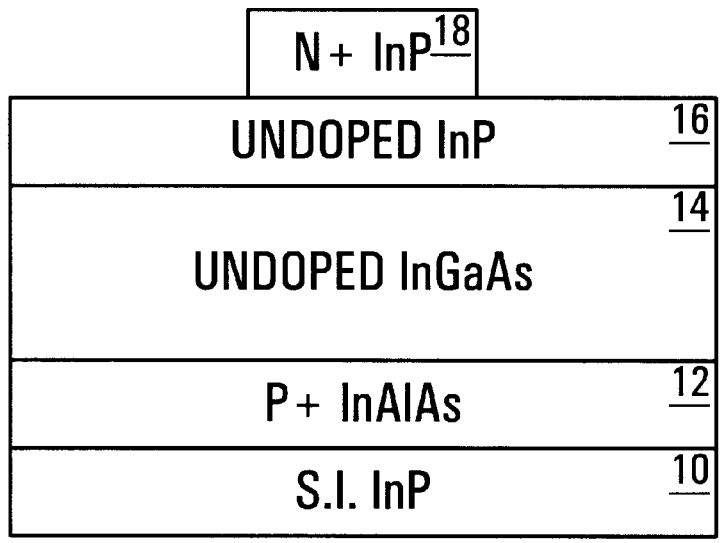
FIG. 2 is a diagram of a later step in the formation of the P-I-N photodiode of the invention, in which the N-layer has been etched to leave an island-like structure.

Referring to FIG. 2, the structure of the P-I-N photodiode following etching of the N-layer is shown. Using techniques well known to those skilled in the art, a dielectric (not shown) has been placed over the N-layer and exposed to light through a mask. Portions of the N-layer 18 are removed by etching, leaving an island-like structure. Because the horizontal dimension of the N-layer 18 is formed by etching rather than by ion implantation through a window in a dielectric layer, the horizontal dimension of the N-layer 18 is controlled accurately. As a result of the etching of the N-layer 18, the upper I-layer 16 is partially exposed.

Figure 3:
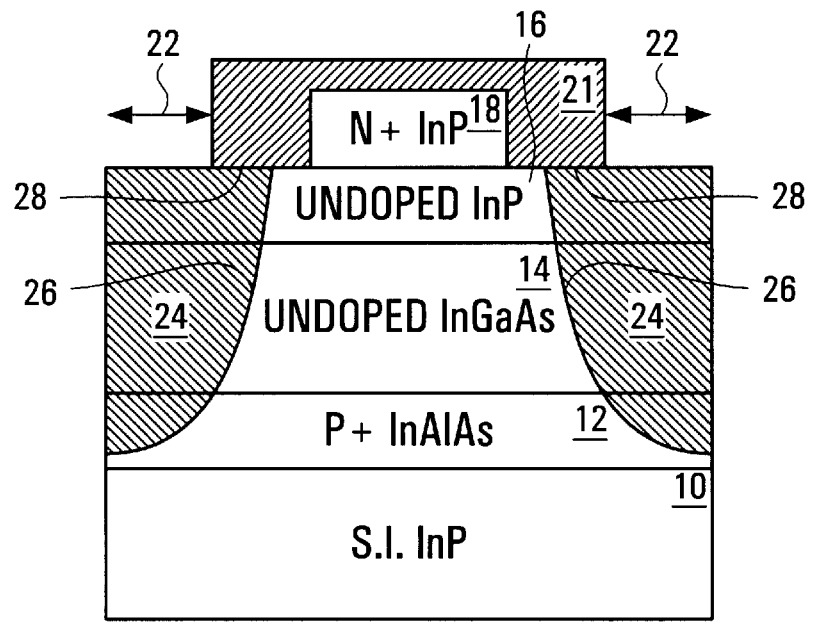
FIG. 3 is a diagram of the semiconductor regions of the P-I-N photodiode of the invention, in which doped regions have been formed.

Referring to FIG. 3, the structure of the P-I-N photodiode following depth diffusion is shown. A dielectric layer 21 is deposited over the N-layer 18 and the upper I-layer 16. Using a mask, windows 22 are formed in the dielectric layer 21 to partially expose the upper I-layer 16. Two doped regions 24 are formed within the P-layer 12 and each I-layer 14 and 16 by deep diffusing impurities through the windows 22 such that the doped regions 24 have a p-type conductivity. Because the doped regions 24 are formed by diffusion, the horizontal boundaries 26 of the doped regions 24 are not well controlled. In particular, diffusion results in some impurities intruding under the edges 28 of the dielectric layer 21, and the doped regions 24 have a geometric profile such that the horizontal dimension of each layer which does not contain doped regions 24 decreases with proximity to the N-layer 18. However, this is not a concern because the doped regions 24 serve mainly to isolate the P-I-N photodiode from adjacent components. In fact the resulting acute angle formed between the horizontal boundaries 26 and the lower edge of the dielectric layer 21 helps to suppress edge breakdown, much as the bevelled edge of a traditional mesa structure P-I-N photodiode helps to suppress edge breakdown.

Figure 4:
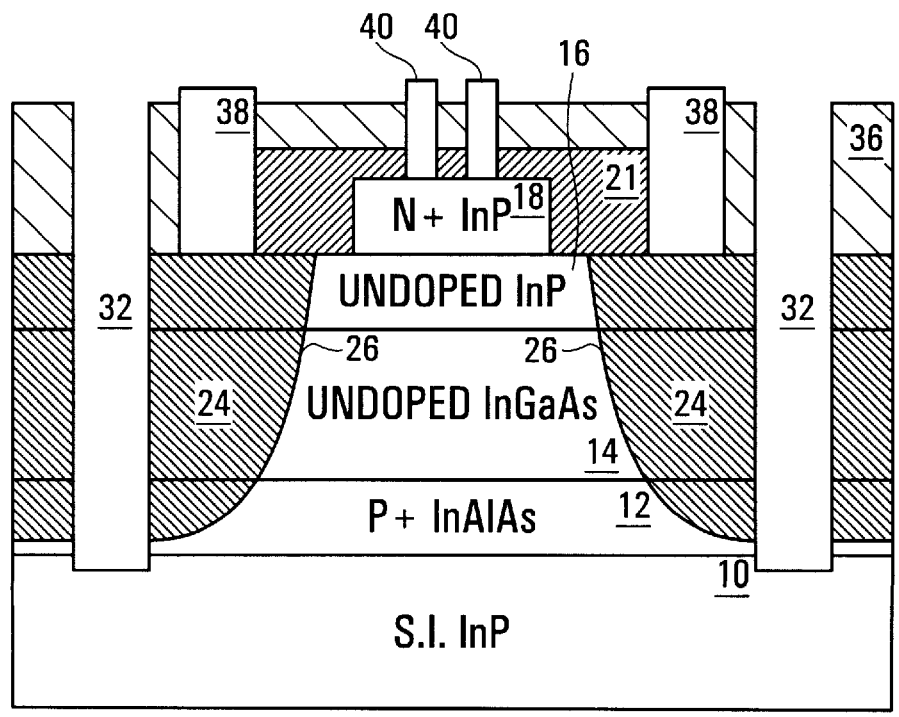
FIG. 4 is a diagram of an example of a P-I-N photodiode of the invention, in which metal connectors and isolation trenches have been added.

Referring to FIG. 4, an example arrangement of electrical contacts and isolations trenches is shown. Two isolation trenches 32 are formed from the surface of the P-I-N photodiode to a depth within the SI-layer 10. The isolation trenches 32 are formed by etching through windows in a dielectric layer 36. The purpose of the isolation trenches 32 is to isolate the wirebond pad of the P-I-N photodiode used when mounting the P-I-N photodiode onto a subcarrier. Metal connectors 38 and 40 are formed, by which circuitry can be connected to the photodiode. The metal connectors 40 connect to the N-layer 18. The metal connectors 38 connect to the doped regions 24 within the upper I-layer 16. Since the doped regions 24 overlap the P-layer 12, the doped regions 24 and the P-layer 12 together effectively form an electrical P-layer. However, other arrangements of metal connectors and isolation trenches can be used.

The types of semiconductor material used and the thickness of each layer described above are for illustration purposes only, and will depend on the exact application for which the P-I-N photodiode will be used. Similarly, the number of I-layers will depend on the exact application for which the P-I-N photodiode will be used, and there may be only one such layer. In photodiodes used in telecommunications the type of semiconductor material used in a single I-layer would most likely be InGaAs.

The invention has been described with respect to P-I-N photodiodes in general. The invention is particularly suited to Avalanche Photodiodes (APDs) since it is in an APD that suppression of edge breakdown is most beneficial. However, as in most APDs, an additional layer is required. A charge sheet layer is epitaxially grown between the two I-layers 14 and 16 during formation of the initial structure shown in FIG. 1. The charge sheet layer is a highly doped layer of semiconductor material. The type of semiconductor material used depends on the exact application for which the APD will be used, InP being a commonly used material in telecommunications. The nature of the doping and the resulting type of conductivity of the charge sheet layer will also depend on the exact application for which the APD will be used.

Figure 5:
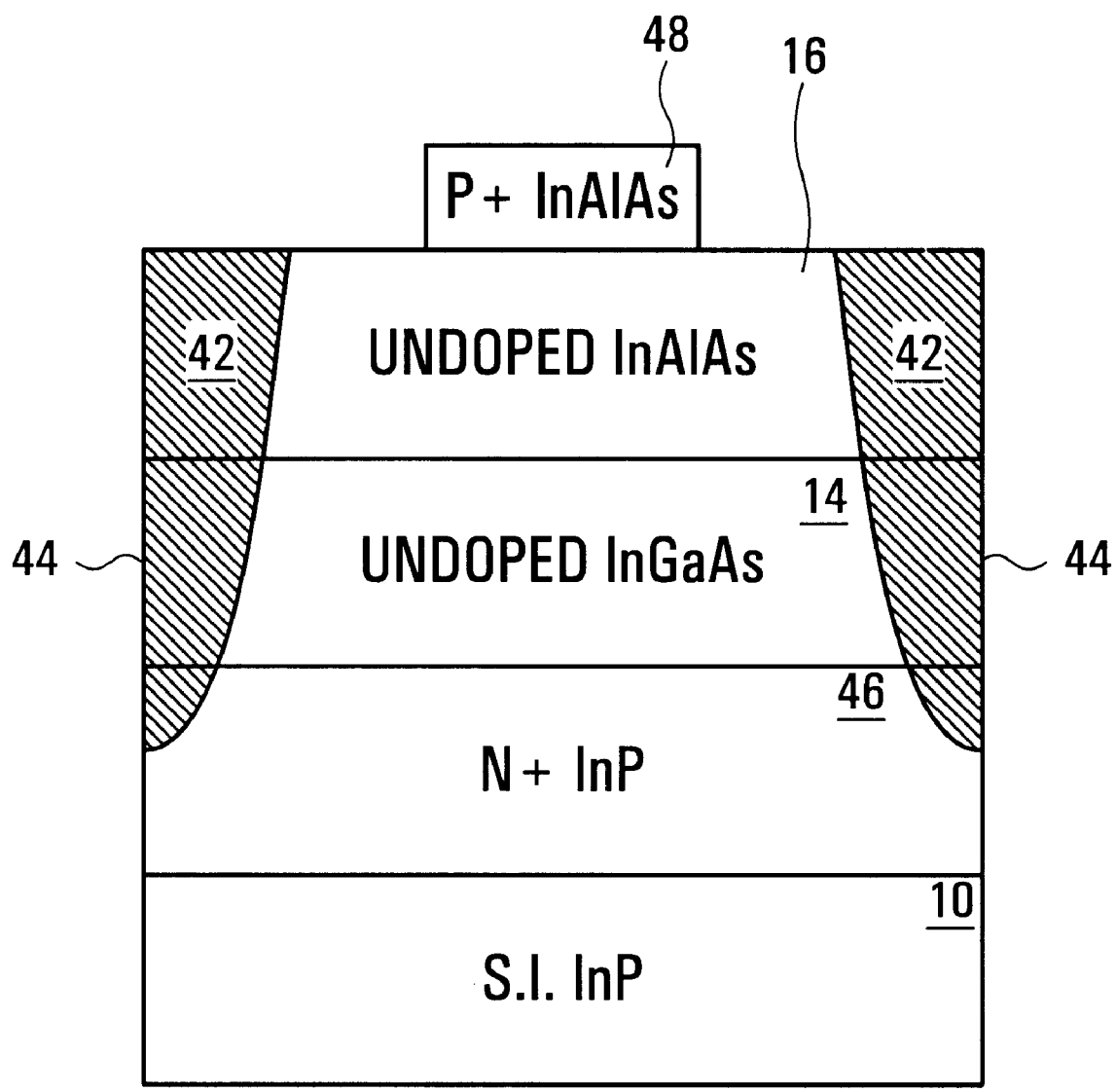
FIG. 5 is a diagram of an alternate embodiment of the P-I-N photodiode of the invention using a non-inverted photodiode.

The invention has been described with respect to an inverted P-I-N diode, in that the upper layer is the semiconductor layer with N-type conductivity rather than the semiconductor layer with P-type conductivity. A non-inverted P-I-N diode can be used, however the doped regions must be formed using techniques other than diffusion, such as ion implantation. Because it is more difficult to achieve deep penetration with ion implantation than with deep diffusion, ion implantation is preferably performed from the side of a mesa structure rather than through the upper surface of the upper I-layer. Referring to FIG. 5, a non-inverted P-I-N photodiode following ion implantation is shown. The various layers are epitaxially grown, and then etched at the horizontal edges to form a mesa structure having vertical surfaces 44. Being non-inverted, the upper doped layer 48 has P-type conductivity and the lower doped layer 46 has N-type conductivity. As in the inverted P-I-N photodiode of FIG. 3, the upper doped layer 48 is partially removed through etching to leave an island-like structure. Ion implantation is performed through the vertical surfaces 44 of the mesa structure, but not into the upper doped layer 48, to form two doped regions 42 having an n-type conductivity. The depth of the ion implantation is controlled such that the horizontal dimension of the portion of the layers 14, 16, and 46 which does not contain the doped regions 42 decreases with proximity to the upper doped layer 48.

As in the inverted P-I-N diode, the types of semiconductor material used in non-inverted P-I-N diodes will depend on the exact application for which the P-I-N photodiode will be used. Use of InAlAs as the material in the upper I-layer 16 may yield higher gain bandwidth than use of InP. However, the non-inverted P-I-N diode implementation may not be as reliable as the inverted implementation because edge breakdown suppression may not be as good due to a high electric field at the edge of the junctions.

What has been described is merely illustrative of the application of the principles of the invention. Other arrangements and methods can be implemented by those skilled in the art without departing from the spirit and scope of the present invention.

We claim:

1. A method of fabricating a semiconductor photodiode comprising epitaxially grown layers of semiconductor material lying substantially parallel to each other, the photodiode having a horizontal direction lying parallel to the layers and a vertical direction lying perpendicular to the layers, the method comprising the steps of:

forming a first doped layer having a p-type conductivity;

forming at least one intrinsic layer, one such intrinsic layer lying adjacent to the first doped layer;

forming a second doped layer having an n-type conductivity, such that the second doped layer is adjacent to one intrinsic layer;

etching parts of the second doped layer to produce an island-like structure, and thereby partially exposing the intrinsic layer lying adjacent to the second doped layer;

following the step of etching parts of the second doped layer, forming a doped region having a p-type conductivity in each of two horizontal edges of each layer except the second doped layer to form two generally vertical boundaries, such that the horizontal dimension of the portion of each layer which does not contain the doped regions decreases with vertical proximity to the second doped layer.

2. The method of claim 1 wherein the step of forming a doped region comprises the steps of:

forming a dielectric layer over the island-like structure and extending on each side partially over the intrinsic layer lying adjacent to the second doped layer; and then deep diffusing impurities through the intrinsic layer lying adjacent to the second doped layer as far as and into the first doped layer.

3. The method of claim 1 further comprising the steps of:

forming a first electrical contact with the second doped layer; and forming a second electrical contact with each doped region within the intrinsic layer which lies adjacent to the second doped layer.

4. The method of claim 1 wherein the first doped layer is a layer of doped InAlAs, the second doped layer is a layer of doped InP, and there are two intrinsic layers, the first intrinsic layer lying adjacent to the first doped layer and being a layer of InGaAs, the second intrinsic layer lying adjacent to the second doped layer and being a layer of InP.

5. The method of claim 1 wherein the first doped layer is a layer of doped InAlAs, the second doped layer is a layer of doped InP, and there is one intrinsic layer, the one intrinsic layer being a layer of InGaAs.

6. The method of claim 1 wherein the step of forming the first doped layer comprises epitaxially growing the first doped layer on a semi-insulating substrate.

7. The method of claim 4 wherein the step of forming the first doped layer comprises epitaxially growing the first doped layer on a semi-insulating substrate of InP.

8. The method of claim 1 wherein the semiconductor photodiode is an avalanche photodiode, wherein the step of forming at least one intrinsic layer forms at least two intrinsic layers, and further comprising the step of forming a charge sheet layer between two intrinsic layers.

9. The method of claim 2 wherein the semiconductor photodiode is an avalanche photodiode, wherein the step of forming at least one intrinsic layer forms at least two intrinsic layers, and further comprising the step of forming a charge sheet layer between two intrinsic layers.

10. A method of fabricating a semiconductor photodiode comprising epitaxially grown layers of semiconductor material lying substantially parallel to each other, the photodiode having a horizontal direction lying parallel to the layers and a vertical direction lying perpendicular to the layers, the method comprising the steps of:

forming a first doped layer having an n-type conductivity;

forming at least one intrinsic layer, one such intrinsic layer lying adjacent to the first doped layer;

forming a second doped layer having a p-type conductivity, such that the second doped layer is adjacent to one intrinsic layer;

etching parts of the second doped layer to produce an island-like structure, and thereby partially exposing the intrinsic layer lying adjacent to the second doped layer;

following the step of etching parts of the second doped layer, forming a doped region having a n-type conductivity in each of two horizontal edges of each layer except the second doped layer to form two generally vertical boundaries, such that the horizontal dimension of the portion of each layer which does not contain the doped regions decreases with vertical proximity to the second doped layer.

11. The method of claim 10 wherein the step of forming a doped region comprises:

etching the horizontal edges of each layer other than the second doped layer to form a mesa structure having vertical surfaces; and then implanting ions through the vertical surfaces of each layer other than the second doped layer.

12. The method of claim 10 further comprising the steps of:

forming a first electrical contact with the second doped layer; and forming a second electrical contact with each doped region within the intrinsic layer which lies adjacent to the second doped layer.

13. The method of claim 10 wherein the first doped layer is a layer of doped InP, the second doped layer is a layer of doped InAlAs, and there are two intrinsic layers, the first intrinsic layer lying adjacent to the first doped layer and being a layer of InGaAs, the second intrinsic layer lying adjacent to the second doped layer and being a layer of InAlAs.

14. The method of claim 10 wherein the first doped layer is a layer of doped InP, the second doped layer is a layer of doped InAlAs, and there is one intrinsic layer, the one intrinsic layer being a layer of InGaAs.

15. The method of claim 10 wherein the step of forming the first doped layer comprises epitaxially growing the first doped layer on a semi-insulating substrate.

16. The method of claim 13 wherein the step of forming the first doped layer comprises epitaxially growing the first doped layer on a semi-insulating substrate of InP.

17. The method of claim 10 wherein the semiconductor photodiode is an avalanche photodiode, wherein the step of forming at least one intrinsic layer forms at least two intrinsic layers, and further comprising the step of forming a charge sheet layer between two intrinsic layers.

18. The method of claim 11 wherein the semiconductor photodiode is an avalanche photodiode, wherein the step of forming at least one intrinsic layer forms at least two intrinsic layers, and further comprising the step of forming a charge sheet layer between two intrinsic layers.

* * * * *